United States Patent
Tauchi et al.

(10) Patent No.: US 8,562,852 B2
(45) Date of Patent: Oct. 22, 2013

(54) PIEZOELECTRIC CERAMIC, PIEZOELECTRIC ELEMENT COMPRISING IT, AND PIEZOELECTRIC DEVICE COMPRISING PIEZOELECTRIC ELEMENT

(75) Inventors: Goushi Tauchi, Tokyo (JP); Daisuke Tanaka, Tokyo (JP); Masahito Furukawa, Tokyo (JP)

(73) Assignee: TDK Corporation, Tokyo (JP)

( * ) Notice: Subject to any disclaimer, the term of this patent is extended or adjusted under 35 U.S.C. 154(b) by 216 days.

(21) Appl. No.: 13/239,135

(22) Filed: Sep. 21, 2011

(65) Prior Publication Data

US 2012/0080636 A1  Apr. 5, 2012

(30) Foreign Application Priority Data

Sep. 30, 2010 (JP) .................. P2010-220850
Sep. 30, 2010 (JP) .................. P2010-221475

(51) Int. Cl.
*C04B 35/49* (2006.01)
*H01L 41/107* (2006.01)
*H01L 41/187* (2006.01)

(52) U.S. Cl.
USPC ............... 252/62.9 PZ; 501/135; 501/136

(58) Field of Classification Search
USPC ................... 252/62.9 PZ; 501/135, 136
See application file for complete search history.

(56) References Cited

U.S. PATENT DOCUMENTS 4,640,905 A * 2/1987 Burn ..................... 501/137
6,207,069 B1   3/2001 Furukawa et al.

FOREIGN PATENT DOCUMENTS

| JP | 2957537 | 7/1999 |
| JP | 2957564 | 7/1999 |
| JP | 2001097774 | * 4/2001 |

* cited by examiner

*Primary Examiner* — Carol M Koslow
(74) *Attorney, Agent, or Firm* — Drinker Biddle & Reath LLP (57) ABSTRACT

According to a preferred embodiment, the piezoelectric ceramic includes a complex oxide having the composition represented by formula (1) or (2), and Mn at 0.2-1.2 mass % or 0.2-3 mass %, respectively, in terms of $MnCO_3$.

$$(Pb_{1-a}A^1_a)Ti_xZr_{1-x-y-z-b}(Zn_{1/3}A^2_{2/3})_y(Yb_{1/2}A^2_{1/2})_zSn_bO_3 \quad (1)$$

$$(Pb_{1-a}A^1_a)Ti_xZr_{1-x-y-b}(Zn_{1/3}A^2_{2/3})_ySn_bO_3 \quad (2)$$

[In formula (1), $A^1$ represents at least one element selected from the group consisting of Ca, Sr and Ba, and $A^2$ is at least one element selected from the group consisting of Nb, Ta and Sb, and includes at least Nb. In formula (2), $A^1$ represents at least one element selected from among Ca, Sr and Ba, $A^2$ represents at least one element selected from among Nb and W, and $A^2$ includes at least Nb.]

8 Claims, 3 Drawing Sheets

PIEZOELECTRIC CERAMIC, PIEZOELECTRIC ELEMENT COMPRISING IT, AND PIEZOELECTRIC DEVICE COMPRISING PIEZOELECTRIC ELEMENT

BACKGROUND OF THE INVENTION

1. Field of the Invention

The present invention relates to a piezoelectric ceramic, to a piezoelectric element comprising it, and to a piezoelectric device comprising the piezoelectric element.

2. Related Background Art

Ultrasonic motors and piezoelectric transducers are examples of applications of piezoelectric ceramics in high-power devices. Such devices require materials that operate at high oscillation speeds and exhibit large amplitudes.

Examples of piezoelectric ceramics that can be driven at high oscillation speeds include piezoelectric ceramics comprising a main component which is a system of lead zirconate titanate ($Pb(Zr, Ti)_3$, (PZT)), as a perovskite-type compound, and an accessory component, known as a relaxer. It is known that particularly high oscillation speeds can be obtained with lead zirconate titanate/lead zinc niobate ($Pb(Zr, Ti)O_3$—$Pb(Zn, Nb)O_3$ (PZT-PZN))-based piezoelectric ceramics, such as described in Japanese Patent Publication No. 2957564 and Japanese Patent Publication No. 2957537.

SUMMARY OF THE INVENTION

Piezoelectric ceramics are preferably capable of operation at high oscillation speeds as mentioned above, but also preferably have minimal vibration-induced heat release, from the viewpoint of effects on surrounding elements during device usage and of minimizing loss of performance due to thermal runaway of the device itself. Generally, however, increasing oscillation speed tends to result in greater heat release due to loss of internal energy, and therefore it has been quite difficult to achieve both high oscillation speed and low heat release in the prior art.

It is therefore desirable, in piezoelectric ceramics, to reduce energy loss to a minimum during conversion of electrical energy to mechanical vibrational energy, thus reducing heat release to prevent thermal runaway.

When such conventional piezoelectric ceramics are used as resonators, increased deviation between resonance frequency and driving frequency has resulted in the problem of a sudden reduction of displacement. Even when a high oscillation speed or large displacement is obtained at room temperature, a large change in resonance frequency with respect to temperature change can result in significantly reduced displacement when the resonator temperature is lowered or raised. In other words, piezoelectric ceramics used in high-power devices are preferred to have stable resonance frequencies with respect to temperature.

In light of this situation, it is a first object of the present invention to provide a piezoelectric ceramic that can exhibit a sufficient oscillation speed and that has low vibration-induced heat release. The invention further provides a piezoelectric element employing the piezoelectric ceramic, and a piezoelectric device comprising it.

It is a second object of the invention to provide a piezoelectric ceramic having high oscillation speed and stable resonance frequency with respect to temperature, as well as a piezoelectric element and piezoelectric device comprising the piezoelectric ceramic.

<First Piezoelectric Ceramic (First Invention)>

The first piezoelectric ceramic of the invention (first invention) comprises a complex oxide having the composition represented by formula (1), and Mn, wherein the Mn content with respect to the total amount of complex oxide is 0.2-1.2 mass % in terms of $MnCO_3$.

$$(Pb_{1-a}A^1{}_a)Ti_xZr_{1-x-y-z-b}(Zn_{1/3}A^2{}_{2/3})_y(Yb_{1/2}A^2{}_{1/2})_zSn_bO_3 \quad (1)$$

[In formula (1), $A^1$ represents at least one element selected from the group consisting of Ca, Sr and Ba, $A^2$ represents at least one element selected from the group consisting of Nb, Ta and Sb and includes at least Nb, and a, b, x, y and z are values satisfying formulas (1a), (1b), (1x), (1y) and (1z), respectively.]

$$0 \leq a \leq 0.04 \quad (1a)$$

$$0 \leq b \leq 0.04 \quad (1b)$$

$$0.40 \leq x \leq 0.49 \quad (1x)$$

$$0.03 \leq y \leq 0.15 \quad (1y)$$

$$0.03 \leq z \leq 0.15 \quad (1z)$$

By including Mn as an additive in the first piezoelectric ceramic, in a specified range with respect to the main component consisting of a PZT-PZN based complex oxide having a specific composition, it is possible to obtain a sufficient amplitude speed and reduce vibration-induced heat release.

In the first piezoelectric ceramic, preferably $A^2$ comprises Nb and at least one element selected from the group consisting of Ta and Sb, or in other words, the elements of $A^2$ include Ta or Sb in addition to Nb. This will make it even easier to achieve both high oscillation speed and low heat release.

The invention further provides a piezoelectric element comprising the first piezoelectric ceramic. The piezoelectric element may be an oscillator comprising a piezoelectric ceramic and electrodes. Since such a piezoelectric element comprises the first piezoelectric ceramic described above, it has a sufficient oscillation speed and low vibration-induced heat release, and can therefore be suitably used as a piezoelectric transducer, ultrasonic motor or ultrasonic oscillator, or as a piezoelectric actuator that utilizes resonance displacement.

The invention further provides a piezoelectric device comprising the first piezoelectric element. Because of the properties of the piezoelectric element of the invention, that has high oscillation speed and low heat release, such a piezoelectric device can be used as a device having sufficiently high output, low effects on surroundings during use, and high resistance to thermal runaway.

<Second Piezoelectric Ceramic (Second Invention)>

The second piezoelectric ceramic of the invention (second invention) provides a piezoelectric ceramic that comprises a complex oxide represented by formula (2), and Mn, wherein the Mn content in terms of $MnCO_3$ is 0.2-3 mass % with respect to the complex oxide.

$$(Pb_{1-a}A^1{}_a)Ti_xZr_{1-x-y-b}(Zn_{1/3}A^2{}_{2/3})_ySn_bO_3 \quad (2)$$

[In formula (2), $A^1$ represents at least one element selected from among Ca, Sr and Ba, $A^2$ represents at least one element selected from among Nb and W, and $A^2$ includes at least Nb.

Also, a, x, y and b are values satisfying formulas (2a), (2x), (2y) and (2b), respectively.]

$$0 \leq a \leq 0.04 \tag{2a}$$

$$0.4 \leq x \leq 0.48 \tag{2x}$$

$$0.03 \leq y \leq 0.2 \tag{2y}$$

$$0.02 \leq b \leq 0.04 \tag{2b}$$

The second piezoelectric ceramic of the invention, having such a construction, has high oscillation speed and stable resonance frequency with respect to temperature. Because such a piezoelectric ceramic has sufficiently excellent piezoelectric characteristics as a material for high-power devices, it is useful as a material for high-power devices such as piezoelectric transducers and ultrasonic motors.

The reason for the effect of high oscillation speed and stable resonance frequency with respect to temperature, exhibited by the second piezoelectric ceramic of the invention, is conjectured by the present inventors to be as follows. The second piezoelectric ceramic of the invention comprises $Zn_{1/3}A^2_{2/3}$ and Sn, where $A^2$ includes at least niobium. This specific combination is believed to result in a high oscillation speed and stable resonance frequency with respect to temperature. Also, presumably the oscillation speed is insufficient if "a" is 0.06 or greater, and the stability of resonance frequency with respect to temperature is reduced if "x" is 0.49 or greater or 0.39 or smaller. It is also presumed to be the case that the stability of resonance frequency with respect to temperature is reduced if "y" is 0.02 or smaller or 0.25 or greater, or if "b" is 0.06 or greater or 0.01 or smaller. Furthermore, polarization can become difficult if the manganese content, in terms of $MnCO_3$, is 0.1 mass % or lower or 4.0 mass % or higher. The second piezoelectric ceramic of the invention has high oscillation speed and stable resonance frequency with respect to temperature, and this is attributed to its composition described above.

In the second piezoelectric ceramic of the invention, $A^2$ preferably includes niobium and tungsten. Such a piezoelectric ceramic has improved stability of resonance frequency with respect to temperature.

The invention further provides a piezoelectric element comprising the second piezoelectric ceramic. Such a piezoelectric element, being provided with the second piezoelectric ceramic, has high oscillation speed and stable resonance frequency with respect to temperature. Moreover, because the piezoelectric element has high oscillation speed and stable resonance frequency with respect to temperature, it is useful as a device material for piezoelectric transducers and ultrasonic motors, as well as ultrasonic oscillators, and piezoelectric actuators that utilize resonance displacement.

The invention further provides a piezoelectric device comprising the second piezoelectric element. Such a piezoelectric device has sufficiently high output because it comprises the second piezoelectric element.

According to the first piezoelectric ceramic of the invention, it is possible to provide a piezoelectric ceramic that exhibits sufficient oscillation speed while having low vibration-induced heat release. It is also possible to provide a piezoelectric element employing the piezoelectric ceramic, and a piezoelectric device comprising it.

Also, according to the second piezoelectric ceramic of the invention, it is possible to provide a piezoelectric ceramic having high oscillation speed and stable resonance frequency with respect to temperature, as well as a piezoelectric element and piezoelectric device comprising the piezoelectric ceramic.

DESCRIPTION OF THE PREFERRED EMBODIMENTS

Preferred embodiments of the invention will now be explained with reference to the accompanying drawings where necessary. For the drawings, identical or corresponding elements will be referred to by like reference numerals and will be explained only once.

<Piezoelectric Element (Oscillator)>

Figure 1:
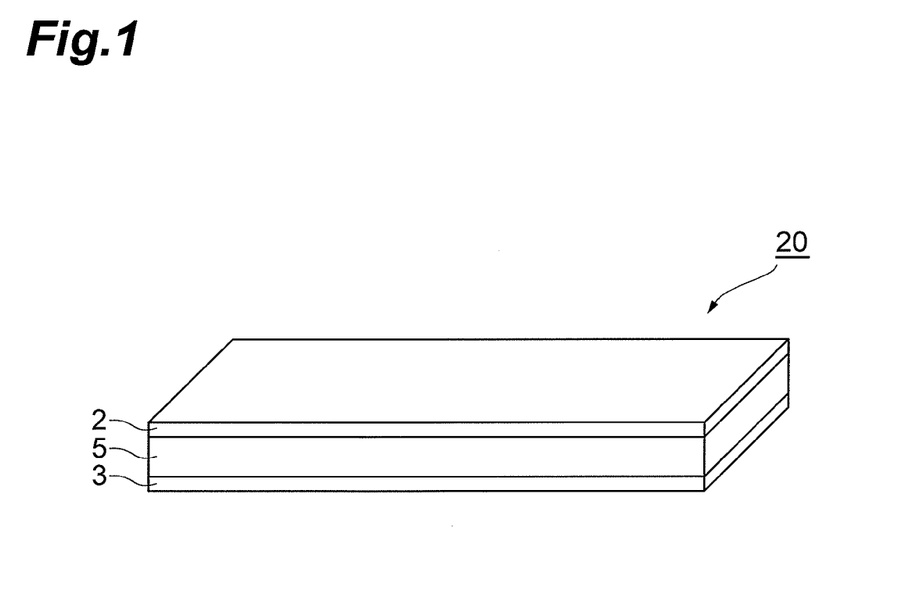
FIG. 1 is a perspective view showing a piezoelectric element according to a preferred embodiment.

FIG. 1 is a perspective view showing a piezoelectric element according to a preferred embodiment. A piezoelectric element having such a construction can be applied as an oscillator, for example. The piezoelectric element 20 shown in FIG. 1 comprises pair of electrodes 2, 3 situated opposing each other, and a piezoelectric ceramic 5 sandwiched between them. The piezoelectric element 20 may be one having, for example, a length of 10-50 mm, a width of 3-10 mm and a height of 1-3 mm.

The electrodes 2, 3 used may be made of electrode materials used for piezoelectric elements, such as Ag electrodes, for example. The dimensions of the electrodes 2, 3 may be appropriately selected according to the purpose.

The piezoelectric ceramic 5 is polarized in the direction of thickness, i.e. the direction in which the pair of electrodes 2, 3 are facing, and application of a voltage between the electrodes 2, 3 produces oscillation which causes contraction in the lengthwise direction. The piezoelectric ceramic 5 is constructed of a piezoelectric ceramic having the following composition.

<First Piezoelectric Ceramic>

A first piezoelectric ceramic will be explained first, as an embodiment of the first invention.

The piezoelectric ceramic 5 comprises a complex oxide having the composition represented by formula (1), and Mn, wherein the Mn content with respect to the total amount of complex oxide is 0.2-1.2 mass % in terms of $MnCO_3$.

$$(Pb_{1-a}A^1_a)Ti_xZr_{1-x-y-z-b}(Zn_{1/3}A^2_{2/3})_y(Yb_{1/2}A^2_{1/2})_zSn_bO_3 \tag{1}$$

[In formula (1), $A^1$ represents at least one element selected from the group consisting of Ca, Sr and Ba, $A^2$ represents at least one element selected from the group consisting of Nb, Ta and Sb and includes at least Nb, and a, b, x, y and z are values satisfying formulas (1a), (1b), (1x), (1y) and (1z), respectively.]

$$0 \leq a \leq 0.04 \tag{1a}$$

$$0 \leq b \leq 0.04 \tag{1b}$$

$$0.40 \leq x \leq 0.49 \tag{1x}$$

$$0.03 \leq y \leq 0.15 \tag{1y}$$

$$0.03 \leq z \leq 0.15 \tag{1z}$$

The complex oxide represented by formula (1) in the piezoelectric ceramic 5 is the main component of the piezoelectric ceramic, and it has a PZT-PZN type composition. In formula (1), $A^1$ is at least one element selected from the group consisting of Ca, Sr and Ba. Also in formula (1), "a" represents the proportion of Pb that is substituted by element A (the substitution rate) and it is 0-0.04, preferably greater than 0 and no greater than 0.04, and more preferably 0.02-0.04. If "a" exceeds 0.04, it will not be possible to obtain sufficient oscillation speed. The more the numerical value of "a" falls within the preferred range, the easier it will be to obtain the desired high oscillation speed and low heat release.

In formula (1), "x" represents the proportion of $PbTiO_3$ in the complex oxide, and it is 0.40-0.49, preferably 0.40-0.48 and more preferably 0.40-0.46. If "x" is outside of this range, the heat release will tend to be increased. The numerical value of x may be appropriately varied within the aforementioned range, depending on whether oscillation speed or heat release during oscillation is of greater need.

In formula (1), $A^2$ is at least one element selected from the group consisting of Nb, Ta and Sb, and $A^2$ includes at least Nb. $A^2$ also preferably includes Ta or Sb in addition to Nb. That is, a portion of Nb is preferably substituted by Ta or Sb. This will make it even easier to achieve both high oscillation speed and low heat release.

In formula (1), "y" is the substitution rate of Zn and element $A^2$ in the complex oxide, and it is 0.03-0.15, preferably 0.03-0.12 and more preferably 0.03-0.09. If "y" is too small the heat release will increase, and if it is too large it will no longer be possible to obtain sufficient oscillation speed. The more the numerical value of "y" falls within the preferred range, the easier it will be to obtain the desired high oscillation speed and low heat release.

The value of "z" is the substitution rate of Yb and $A^2$ in the complex oxide, and it is 0.03-0.15, preferably 0.03-0.12 and more preferably 0.03-0.09. If "z" is too small the heat release will increase, and if it is too large it will no longer be possible to obtain sufficient oscillation speed. The more the numerical value of "z" falls within the preferred range, the easier it will be to obtain the desired high oscillation speed and low heat release.

Also, "b" in formula (1) is the content ratio of Sn in the complex oxide, and it is 0-0.04, preferably greater than 0 and no greater than 0.04, and more preferably 0.02-0.04. If "b" is greater than 0.04, the energy loss will increase and more heat release will result. The more the numerical value of "b" falls within the preferred range, the easier it will be to obtain the desired high oscillation speed and low heat release.

Mn, on the other hand, is present as an accessory component in the piezoelectric ceramic 5, and it is, for example, in the form of Mn alone or Mn oxide, being in solid solution in the complex oxide, or present at the grain boundaries of crystals composed of the complex oxide. The Mn content in the piezoelectric ceramic 5 is 0.2-1.2 mass %, preferably 0.3-1.2 mass % and more preferably 0.3-0.8 mass %, in terms of $MnCO_3$, with respect to 100 mass % of the complex oxide as the main component. The more the Mn content falls within the preferred range, the easier it will be to obtain the desired high oscillation speed and low heat release.

The piezoelectric ceramic 5 may also contain Fe, Co, Sc, Ga, Cr, Mg, Cu or the like, either alone or as compounds, as accessory components in addition to the components mentioned above, depending on the desired properties. When such elements are included as accessory components, their content is preferably 0.1-1 mass % with respect to the complex oxide, in terms of the corresponding oxides.

The composition of the piezoelectric ceramic 5 may be measured by X-ray diffraction or ICP emission spectroscopic analysis, for example. The content of the complex oxide as the main component in the piezoelectric ceramic 5 is preferably 90 mass % or greater, more preferably 95 mass % or greater and even more preferably 98 mass % or greater, based on the total piezoelectric ceramic 5. If the content ratio of the main component is within this range, it will be possible to obtain oscillation speed that is sufficient for practical use as a piezoelectric ceramic.

The piezoelectric ceramic also preferably has a relative density of 95% or greater. Throughout the present specification, "relative density" refers to the measured value of the density with respect to the theoretical density. The theoretical density is the value calculated from the lattice constant determined by X-ray diffraction, and the stoichiometric ratio for a perfect crystal. A piezoelectric ceramic having a high relative density will exhibit excellent piezoelectric characteristics. The relative density of the piezoelectric ceramic can be measured by Archimedes' method, for example. The relative density of the piezoelectric ceramic can also be adjusted by varying the firing temperature or firing time during its production.

The crystal grain size of the piezoelectric ceramic 5 is preferably no greater than 3 μm and more preferably no greater than 1 μm. If the crystal grain size of the piezoelectric ceramic exceeds 3 μm, the transverse strength will tend to be significantly reduced. Throughout the present specification, the crystal grain size of the piezoelectric ceramic is defined as the circular area-equivalent diameter.

<Second Piezoelectric Ceramic>

A second piezoelectric ceramic will now be explained, as an embodiment of the second invention. Explanation of the parts corresponding to those of the first piezoelectric ceramic will be omitted as appropriate.

The piezoelectric ceramic of this embodiment comprises a complex oxide represented by formula (2), and Mn, wherein the Mn content in terms of $MnCO_3$ is 0.2-3 mass % with respect to the complex oxide.

$$(Pb_{1-a}A^1_a)Ti_xZr_{1-x-y-b}(Zn_{1/3}A^2_{2/3})_ySn_bO_3 \quad (2)$$

[In formula (2), $A^1$ represents at least one element selected from among calcium (Ca), strontium (Sr) and barium (Ba), $A^2$ represents at least one element selected from among niobium (Nb) and tungsten (W), and $A^2$ includes at least niobium. Also, a, x, y and b are values satisfying formulas (2a), (2x), (2y) and (2b), respectively.]

$$0 \leq a \leq 0.04 \quad (2a)$$

$$0.4 \leq x \leq 0.48 \quad (2x)$$

$$0.03 \leq y \leq 0.2 \quad (2y)$$

$$0.02 \leq b \leq 0.04 \quad (2b)$$

Such a piezoelectric ceramic has high oscillation speed and stable resonance frequency with respect to temperature. Also, because such a piezoelectric ceramic has sufficiently excellent piezoelectric characteristics as a material for high-power devices, it is useful as a material for high-power devices such as piezoelectric transducers and ultrasonic motors.

As mentioned above, "a" is in the range of 0-0.04. From the viewpoint of further increasing the oscillation speed, "a" is preferably in the range of 0-0.02.

As mentioned above, "x" is in the range of 0.4-0.48. From the viewpoint of further improving the stability of resonance frequency with respect to temperature, "x" is preferably in the range of 0.4-0.47.

As mentioned above, "y" is in the range of 0.03-0.2. From the viewpoint of further improving the stability of resonance frequency with respect to temperature, "y" is preferably in the range of 0.03-0.12 and more preferably in the range of 0.03-0.09.

As mentioned above, $A^1$ is at least one element selected from among Ca, Sr and Ba. From the viewpoint of further improving the stability of resonance frequency with respect to temperature, $A^1$ is preferably Ca.

From the viewpoint of yet further improving the stability of resonance frequency with respect to temperature, $A^2$ more preferably includes niobium and tungsten.

When $A^2$ includes niobium and tungsten, the amount of tungsten is preferably in a molar ratio of 0-0.83 and more preferably 0-0.5, with respect to the total of niobium and tungsten.

As mentioned above, the manganese content of the piezoelectric ceramic of this embodiment, in terms of $MnCO_3$, is 0.2-3 mass % with respect to the complex oxide represented by formula (2). From the viewpoint of facilitating polarization and obtaining a higher oscillation speed, the content is preferably 0.2-1 mass % and more preferably 0.2-0.4 mass %.

The piezoelectric ceramic may also contain a component other than a complex oxide represented by formula (2) and manganese. Examples of such components include Fe, Co, Sc, Ga, Cr, Mg and Cu. When the piezoelectric ceramic contains such a component, the content of the component with respect to the complex oxide represented by formula (2) is preferably 0.1-1 mass % and more preferably 0.1-0.5 mass %.

The piezoelectric ceramic will usually be composed of a sintered material, i.e. a polycrystalline body, and the manganese in the piezoelectric ceramic may be a compound in solid solution with the complex oxide represented by formula (2), or it may be segregated as an oxide or other compound at the grain boundaries of the crystal grains of the complex oxide.

The second piezoelectric ceramic of this embodiment described above may be suitably used in a piezoelectric element that is employed in an ultrasonic motor, piezoelectric transducer or the like, as a piezoelectric ceramic with increased oscillation speed and stable resonance frequency with respect to temperature.

A preferred embodiment of a method for producing the piezoelectric element 20 described above will now be explained.

<Method for Producing Piezoelectric Element>

As the starting materials for the piezoelectric ceramic 5 of the first piezoelectric element there are prepared powders of lead oxide (PbO), titanium oxide ($TiO_2$), zirconium oxide ($ZrO_2$), zinc oxide (ZnO), niobium oxide ($Nb_2O_5$), tin oxide ($SnO_2$), ytterbium oxide ($Yb_2O_3$) and manganese carbonate ($MnCO_3$), or if necessary calcium carbonate ($CaCO_3$), strontium carbonate ($SrCO_3$), barium carbonate ($BaCO_3$), tantalum oxide ($Ta_2O_5$) and antimony oxide ($Sb_2O_5$). The starting powders are each weighed out so that the post-firing composition of the piezoelectric ceramic 5 for this embodiment is obtained.

Also, as the starting materials for the piezoelectric ceramic 5 of the second piezoelectric element there are prepared powders of lead oxide (PbO), titanium oxide ($TiO_2$), zirconium oxide ($ZrO_2$), zinc oxide (ZnO), niobium oxide ($Nb_2O_5$) and tin oxide ($SnO_2$), and if necessary calcium carbonate ($CaCO_3$), strontium carbonate ($SrCO_3$), barium carbonate ($BaCO_3$) and manganese carbonate ($MnCO_3$). The starting powders are weighed out so that the fired piezoelectric ceramic (sintered material) has the composition of the piezoelectric ceramic 5 for this embodiment.

The weighed out starting powders are wet blended with a ball mill or the like. The mixture obtained by wet blending is calcined to obtain a calcined body. The calcination may be carried out in air, for example. The calcination temperature is preferably 700-850° C., and the calcination time is preferably about 2 hours.

The obtained calcined body is subjected to wet grinding with a ball mill or the like and the product is dried to obtain a calcined powder. Next, a small amount of binder is added to the calcined powder, and the mixture is molded by press molding, for example, to obtain a compact. The molding pressure for this may be 5 t/cm², for example. There are no particular restrictions on the shape of the compact, and it may be any shape that allows the desired shape for the piezoelectric ceramic 5 to be obtained, but as an example it may be a tabular compact with planar dimensions of 50 mm×50 mm and a thickness of about 10 mm.

The obtained compact is then fired to obtain a piezoelectric ceramic. The firing may be carried out in air, for example. The firing temperature is preferably 950-1200° C., and the firing time is preferably about 2 hours. This can yield a piezoelectric ceramic having a relative density of 95% or greater.

Next, the fired piezoelectric ceramic is cut to desired dimensions if necessary, to obtain a piezoelectric ceramic 5 having the desired shape. The cut dimensions are not particularly restricted and may be, for example, dimensions of 12 mm×3 mm with a thickness of about 1 mm. A metal electrode of silver or the like is then baked onto both sides of the piezoelectric ceramic 5 to form electrodes 2, 3.

The piezoelectric ceramic 5 on which the electrodes 2, 3 have been baked is then subjected to polarization treatment in silicone oil at about 120° C., for example, to obtain a piezoelectric element (oscillator) 20 with piezoelectric characteristics. There are no particular restrictions on the polarization treatment conditions, but preferably polarization treatment is conducted for about 30 minutes in the thickness direction, with an electric field of about 2 kV/mm.

<Laminated Piezoelectric Element>

A simple tabular piezoelectric element having a structure with a piezoelectric ceramic sandwiched between a pair of electrodes was described above, and examples for the piezoelectric element include a laminated piezoelectric element having a plurality of internal electrodes embedded in a piezoelectric ceramic. Another embodiment of a piezoelectric element will now be explained, as a laminated piezoelectric element.

Figure 2:
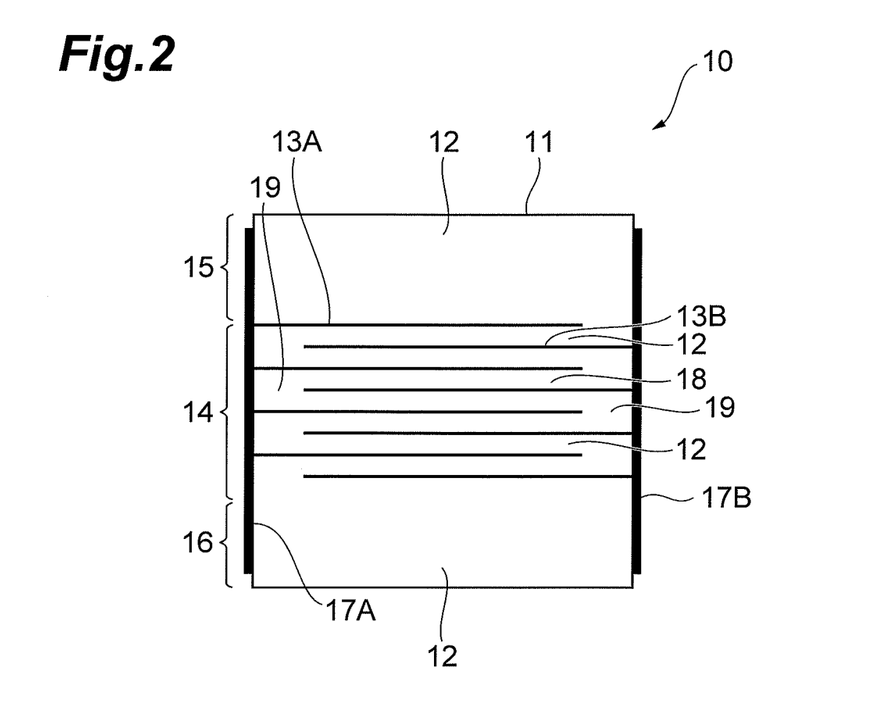
FIG. 2 is a cross-sectional view showing another embodiment of a piezoelectric element.

FIG. 2 is a cross-sectional view showing another embodiment of a piezoelectric element (oscillator). The laminated piezoelectric element 10 shown in FIG. 2, which is a laminated-type piezoelectric element (piezoelectric oscillating element), comprises a cuboid laminated body 11 and a pair of terminal electrodes 17A, 17B formed on the end faces facing the laminated body 11.

The laminated body 11 is composed of an element assembly 14 obtained by alternating lamination of internal electrode layers (electrode layers) 13A, 13B via piezoelectric layers 12, and a pair of protective layers 15 and 16 formed sandwiching the element assembly 14 from both end faces (above and below in the drawing) in the stacking direction. That is, in the element assembly 14, the piezoelectric layers 12 and internal electrode layers 13A, 13B are alternately stacked.

The piezoelectric layer 12 is a layer composed of a piezoelectric ceramic, and the same material may be applied as for the piezoelectric ceramic 5 of the embodiment described above. The thickness of each layer of the piezoelectric layer 12 may be set as desired, and may be 1-100 μm, for example.

The internal electrode layers 13A, 13B are formed parallel to each other. The internal electrode layers 13A are formed in such a manner that one end of each is exposed at the end face of the laminated body 11 on which the terminal electrode 17A has been formed. The internal electrode layers 13B are formed in such a manner that one end of each is exposed at the end face of the laminated body 11 on which the terminal electrode 17B has been formed. Each of the internal electrodes 13A, 13B is alternately exposed at a different end face facing the laminated body 11. Also, the internal electrode layer 13A and internal electrode 13B are situated so that their major sections are stacked in the direction of lamination.

The active regions 18 of the piezoelectric layers 12 between the internal electrodes 13A, 13B in the laminated body 11 are the active sections that expand (are displaced) in the direction of lamination when a voltage is applied to the internal electrode layers 13A, 13B. The regions 19 that are not between the internal electrode layers 13A, 13B are the inactive sections which are not displaced.

The material used for the internal electrode layers 13A, 13B may be, for example, a metal such as Au, Pt, Pd, Ni, Cu or Ag, or an alloy containing two or more of such metals (such as an Ag—Pd alloy).

The protective layers 15, 16 are composed of a ceramic, and are preferably layers composed of a piezoelectric ceramic. Piezoelectric ceramics to be used for formation of the protective layers 15, 16 include the same ones as for the piezoelectric layers 12. FIG. 2 shows a case in which the protective layers 15, 16 are the same as the piezoelectric layer 12, but the protective layers 15, 16 may be different layers from the piezoelectric layer 12.

The terminal electrodes 17A, 17B are in contact with the ends of the internal electrode layers 13A, 13B exposed at the end faces of the laminated body 11 on which they are formed. Electrical connection is thus established between the terminal electrodes 17A, 17B and the internal electrodes 13A, 13B. The terminal electrodes 17A, 17B may be composed of a conductive material consisting mainly of Ag, Au, Cu or the like. The thicknesses of the terminal electrodes 17A, 17B may be appropriately set according to the purpose of use and the size of the laminated piezoelectric element, and for example, they may be 10-50 µm.

<Method for Producing Laminated Piezoelectric Element>

An example of a method for producing a laminated piezoelectric element 10 of the form described above will now be explained.

For production of the laminated piezoelectric element 10, first the starting materials (starting powders) are prepared as in the method for producing a piezoelectric ceramic 5 described above, and their mixture is calcined to obtain a calcined powder. Next, an organic binder, organic solvent, organic plasticizer and the like are added to the calcined powder and mixed therewith for about 20 hours using a ball mill or the like, to obtain a piezoelectric paste.

The piezoelectric paste is coated onto a polyethylene terephthalate (PET) base film by doctor blading, for example, to obtain a piezoelectric green sheet for formation of the piezoelectric layer 12. The piezoelectric green sheet has a structure comprising mainly the calcined powder and a binder.

The piezoelectric green sheet is then coated with an electrode paste for formation of the internal electrode layers 13A, 13B by a screen printing method or the like, to form an electrode paste layer composed of the electrode paste. A laminating sheet is thus obtained comprising the electrode paste layer on the piezoelectric green sheet. The electrode paste layer is formed into a pattern to obtain the shapes of the aforementioned internal electrode layers 13A and 13B.

The electrode paste used to form the electrode paste layer comprises a binder and an organic solvent added to the metals which are to form the internal electrodes 13A, 13B (metals such as Au, Pt, Pd, Ni, Cu and Ag, or alloys of two or more of such metals (Ag—Pd alloy, for example). The binder and organic solvent may be publicly known ones. The total content of the metal in the electrode paste is preferably at least 40 mass % and more preferably 50-60 mass %.

Several laminating sheets obtained in this manner are then stacked in such a manner that the electrode paste layers and piezoelectric green sheets are alternately situated, and several piezoelectric green sheet layers are further laminated onto the surface of both end faces in the direction of lamination of the stacked structure. The laminated body obtained in this manner is pressed in the direction of lamination while heating appropriately, and is cut to the prescribed size if necessary, to obtain a green laminated body (laminated body).

The green laminated body is then set on a magnesia setter or the like and heated in an air atmosphere for degreasing treatment to remove the binder or organic solvent in the piezoelectric green sheet and electrode paste layer.

Next, the green laminated body from which the binder has been removed is subjected to firing treatment (main firing) by heating in a sealed container (in an air atmosphere, for example), to obtain a laminated body 11. There are no particular restrictions on the firing temperature and firing time for the firing treatment, and they may be 900-1015° C. and 1-10 hours, for example. The piezoelectric green sheet and electrode paste layer are integrally fired in this main firing treatment, the internal electrode layers 13A, 13B are formed from the electrode paste layer, and the piezoelectric layer 12 is formed from the piezoelectric green sheet sandwiched between the internal electrode layers 13A, 13B. Also, the protective layers 15, 16 are formed from the laminated piezoelectric green sheet on both end faces in the direction of lamination of the green laminated body.

The terminal electrodes 17A, 17B are then baked onto the mutually opposing end faces that are parallel in the direction of lamination of the obtained laminated body 11 (the end faces where the ends of the internal electrode layers 13A, 13B are exposed). Specifically, a terminal electrode-forming paste containing the metal for the terminal electrodes 17A, 17B, the organic binder and other components may be coated onto the aforementioned end faces of the laminated body 11 and then fired to form the terminal electrodes 17A, 17B. This produces a laminated piezoelectric element 10 having the structure shown in FIG. 2. The terminal electrodes 17A, 17B can also be formed by a method such as sputtering, vapor deposition, electroless plating or the like, instead of the baking method described above.

Also, the laminated piezoelectric element 10 may be subjected to polarization treatment wherein a voltage is applied between the terminal electrodes 17A, 17B for about 10-30 minutes to an electric field strength of 1-3 kV/mm in an environment of room temperature to 120° C., to obtain a laminated piezoelectric element 10 with piezoelectric characteristics.

A piezoelectric element (oscillator) was described above as an example of a preferred embodiment of the invention, and such a piezoelectric element, having high oscillation speed and high strength (transverse strength), can be suitably used in a piezoelectric device, such as a piezoelectric transducer or ultrasonic motor, or an ultrasonic oscillator, or a piezoelectric actuator that utilizes resonance displacement.

The invention, incidentally, is not limited to the embodiments described above. For example, a known structure other than the embodiment described above may be appropriately used in a piezoelectric element, in a construction other than a piezoelectric ceramic. Also, for production of a piezoelectric element, the calcined powder obtained by calcining the starting powders may be produced by a hydrothermal synthesis process, for example.

EXAMPLES

The present invention will now be explained in greater detail based on examples and comparative examples, with the understanding that these examples are in no way limitative on the invention.

First Piezoelectric Element

[Production of Oscillators (Piezoelectric Elements): Samples No. 1-1 to 1-26 and 1-31 to 1-42]

First, lead oxide (PbO), titanium oxide ($TiO_2$), zirconium oxide ($ZrO_2$), zinc oxide (ZnO), niobium oxide ($Nb_2O_5$), tin oxide ($SnO_2$), calcium carbonate ($CaCO_3$), strontium carbonate ($SrCO_3$), barium carbonate ($BaCO_3$), manganese carbonate ($MnCO_3$) and ytterbium oxide ($Yb_2O_3$) were prepared as starting materials for the piezoelectric ceramic, and the powders were combined in different proportions so that each of the post-firing compositions was $(Pb_{1-a}A^1{}_a)Ti_xZr_{1-x-y-z-b}(Zn_{1/3}Nb_{2/3})_y(Yb_{1/2}Nb_{1/2})_zSn_bO_3$+c mass % $MnCO_3$, with the type of element A and the numerical values of a, b, c, x, y and z as shown in Table 1, to prepare different mixtures.

Each mixture was subjected to wet blending with a ball mill, and the resulting mixture was calcined in air at 700-850° C. for 2 hours, after which the calcined product was subjected to wet grinding with a ball mill. After then adding a small amount of a binder to the ground calcined product, it was molded at a pressure of approximately 5 t/cm² to obtain a tabular compact with planar dimensions of 50 mm×50 mm and a thickness of 10 mm.

The compact was fired in air at 950-1200° C. for 2 hours (main firing) to obtain a piezoelectric ceramic sample. Density measurement of each piezoelectric ceramic sample showed that all of the samples had a density (relative density) of at least 95% of theoretical density.

Each of the piezoelectric ceramic samples was cut to 12 mm×3 mm and a thickness of 1 mm, and Ag electrodes were baked onto both sides. Next, polarization treatment was conducted for 30 minutes in the thickness direction with a 2 kV/mm electric field, in silicone oil at 120° C., to obtain an oscillator (piezoelectric element).

[Evaluation of Properties]

Figure 3:
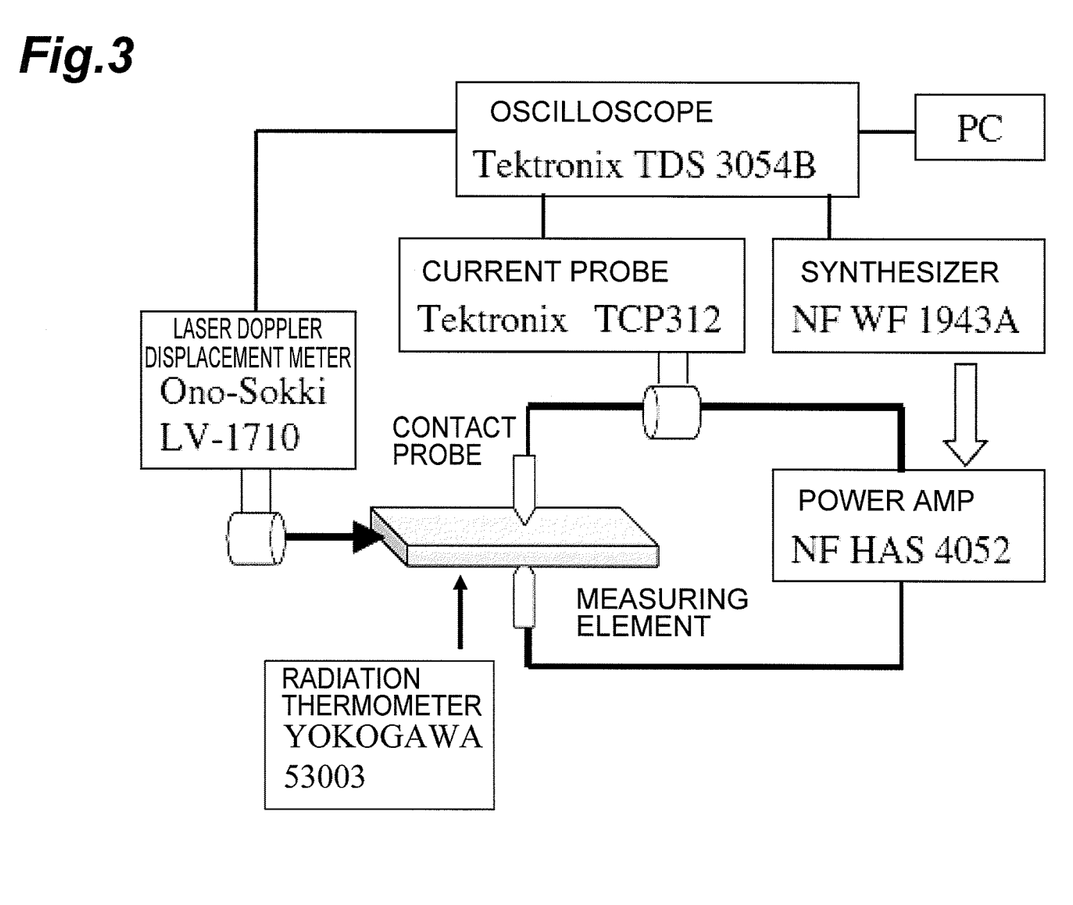
FIG. 3 is a general schematic illustration of the oscillation speed measuring apparatus used for evaluation.

In order to examine the high-power driving characteristics of all of the obtained oscillator samples, each oscillator was measured for oscillation speed and its associated heat release using the measuring system shown in FIG. 3. In the measuring system, as shown in FIG. 3, the center sections of the electrodes of the measuring element were held by contact probes, the driving voltage was set to 150 V with a rectangular driving waveform, and a signal at the driving frequency was applied having a numerical value near the resonance frequency previously determined using an impedance analyzer. The oscillation speed was determined from the value measured by a laser Doppler displacement meter, and the heat value was determined using a radiation thermometer.

The results are summarized in Table 1. The oscillation speed shown in Table 1 is shown as the maximum oscillation speed obtained during the driving test, and the heat release is shown as the difference between the temperature of the oscillator at maximum oscillation speed, and the initial temperature of the oscillator. Also, column "$A^1$" in Table 1 shows the type of element included as element $A^1$, where a listing of "–" indicates cases where no element A was included, i.e. a=0. Sample No. 1-42 corresponds to the results obtained using a piezoelectric ceramic with the piezoelectric ceramic composition described in Japanese Patent Publication No. 2957564.

TABLE 1

| Sample No. | Piezoelectric ceramic composition | | | | | | Property evaluation | |
|---|---|---|---|---|---|---|---|---|
| | | | | | | | Oscillation speed | Heat release |
| | $A^1$ | a | x | y | z | b | c | (m/sec) | (° C.) |
| 1-31 | Ca | 0.02 | 0.38 | 0.15 | 0.03 | 0.02 | 0.30 | 1.71 | 33.2 |
| 1-1 | Ca | 0.02 | 0.40 | 0.15 | 0.03 | 0.02 | 0.30 | 1.20 | 16.8 |
| 1-2 | Ca | 0.02 | 0.42 | 0.15 | 0.03 | 0.02 | 0.80 | 1.44 | 24.9 |
| 1-3 | Ca | 0.02 | 0.45 | 0.15 | 0.03 | 0.02 | 0.80 | 1.36 | 19.8 |
| 1-4 | Ca | 0.02 | 0.46 | 0.15 | 0.03 | 0.02 | 0.80 | 1.27 | 14.7 |
| 1-5 | Ca | 0.02 | 0.48 | 0.15 | 0.03 | 0.02 | 0.80 | 1.15 | 9.5 |
| 1-6 | Ca | 0.02 | 0.49 | 0.15 | 0.03 | 0.02 | 0.80 | 1.06 | 6.9 |
| 1-32 | Ca | 0.02 | 0.51 | 0.15 | 0.03 | 0.02 | 0.30 | 1.64 | 29.2 |
| 1-33 | Ca | 0.02 | 0.47 | 0.02 | 0.02 | 0.02 | 0.30 | 1.68 | 32.7 |
| 1-7 | Ca | 0.02 | 0.40 | 0.03 | 0.15 | 0.02 | 0.30 | 1.28 | 14.8 |
| 1-8 | Ca | 0.02 | 0.45 | 0.03 | 0.06 | 0.02 | 0.30 | 1.40 | 16.1 |
| 1-9 | Ca | 0.02 | 0.46 | 0.03 | 0.03 | 0.02 | 0.30 | 1.82 | 24.0 |
| 1-10 | Ca | 0.02 | 0.45 | 0.06 | 0.03 | 0.02 | 0.30 | 1.32 | 17.8 |
| 1-11 | Ca | 0.02 | 0.43 | 0.09 | 0.03 | 0.02 | 0.30 | 1.13 | 16.3 |
| 1-12 | Ca | 0.02 | 0.43 | 0.06 | 0.06 | 0.02 | 0.30 | 1.35 | 16.9 |
| 1-13 | Ca | 0.02 | 0.40 | 0.12 | 0.06 | 0.02 | 0.30 | 1.29 | 16.8 |
| 1-14 | Ca | 0.02 | 0.40 | 0.09 | 0.09 | 0.02 | 0.30 | 1.34 | 17.5 |
| 1-15 | Ca | 0.02 | 0.40 | 0.06 | 0.12 | 0.02 | 0.30 | 1.26 | 15.4 |
| 1-34 | Ca | 0.02 | 0.47 | 0.03 | 0.18 | 0.02 | 0.30 | 0.93 | 7.7 |
| 1-35 | Ca | 0.02 | 0.47 | 0.18 | 0.03 | 0.02 | 0.30 | 0.90 | 8.2 |
| 1-36 | — | 0.00 | 0.46 | 0.03 | 0.03 | 0.02 | 0.10 | Not polarizable | — |
| 1-16 | — | 0.00 | 0.46 | 0.03 | 0.03 | 0.02 | 0.20 | 1.29 | 18.7 |
| 1-17 | — | 0.00 | 0.46 | 0.03 | 0.03 | 0.02 | 0.30 | 1.61 | 24.0 |
| 1-18 | — | 0.00 | 0.46 | 0.03 | 0.03 | 0.02 | 0.40 | 1.83 | 24.8 |
| 1-19 | — | 0.00 | 0.46 | 0.03 | 0.03 | 0.02 | 0.80 | 1.69 | 19.4 |

TABLE 1-continued

| Sample No. | Piezoelectric ceramic composition | | | | | | | Property evaluation | |
|---|---|---|---|---|---|---|---|---|---|
| | $A^1$ | a | x | y | z | b | c | Oscillation speed (m/sec) | Heat release (°C.) |
| 1-20 | — | 0.00 | 0.46 | 0.03 | 0.03 | 0.02 | 1.20 | 1.72 | 23.2 |
| 1-37 | — | 0.00 | 0.47 | 0.03 | 0.03 | 0.02 | 2.00 | 1.74 | 32.5 |
| 1-21 | — | 0.00 | 0.47 | 0.03 | 0.03 | 0.00 | 0.40 | 1.64 | 18.4 |
| 1-22 | Ca | 0.02 | 0.47 | 0.03 | 0.03 | 0.00 | 0.30 | 1.64 | 18.5 |
| 1-23 | Ca | 0.04 | 0.46 | 0.03 | 0.03 | 0.02 | 0.30 | 1.47 | 13.3 |
| 1-38 | Ca | 0.06 | 0.46 | 0.03 | 0.03 | 0.02 | 0.30 | 0.90 | 6.3 |
| 1-24 | Ca | 0.02 | 0.45 | 0.03 | 0.03 | 0.04 | 0.30 | 1.83 | 24.2 |
| 1-39 | Ca | 0.02 | 0.44 | 0.03 | 0.03 | 0.06 | 0.30 | 1.80 | 28.9 |
| 1-25 | Ba | 0.02 | 0.46 | 0.03 | 0.03 | 0.02 | 0.30 | 1.81 | 24.1 |
| 1-40 | Ba | 0.06 | 0.46 | 0.03 | 0.03 | 0.02 | 0.30 | 0.88 | 5.9 |
| 1-26 | Sr | 0.02 | 0.46 | 0.03 | 0.03 | 0.02 | 0.30 | 1.81 | 23.9 |
| 1-41 | Sr | 0.06 | 0.46 | 0.03 | 0.03 | 0.02 | 0.30 | 0.87 | 6.0 |
| 1-42 | — | 0.00 | 0.42 | 0.18 | 0.00 | 0.00 | 0.80 | 1.82 | 31.1 |

Table 1 confirms that sufficiently high oscillation speed and adequately reduced heat release were obtained by samples No. 1-1 to 1-26, which had complex oxide and Mn contents within the ranges of the invention, compared to samples No. 1-31 to 1-42 that were outside of the ranges.

In particular, comparison between samples No. 1-1 to 1-6, 1-31 and 1-32 confirms that sufficient oscillation speed for practical use and adequately reduced heat release can be obtained when $0.40 \leq x \leq 0.49$.

Also, comparison between samples No. 1-7 to 1-15, 1-31 and 1-33 to 1-35 confirms that sufficiently high oscillation speed and adequately reduced heat release can be obtained when $0.03 \leq y \leq 0.15$ and $0.03 \leq z \leq 0.15$.

Also, comparison between samples No. 1-21 to 1-23, 1-38, 1-40 and 1-41 confirms that sufficiently high oscillation speed and adequately reduced heat release can be obtained when $0 \leq a \leq 0.04$.

In addition, comparison between samples No. 1-9, 1-22 and 1-24 and 1-39 confirms that sufficiently high oscillation speed and adequately reduced heat release can be obtained when $0 \leq b \leq 0.04$.

[Production of Oscillators (Piezoelectric Elements): Samples No. 1-51 to 1-54 and 1-60 to 1-61]

Oscillators for samples No. 1-51 to 1-54 and 1-60 to 1-61 were obtained in the same manner as sample No. 1-1, except that tantalum oxide ($Ta_2O_5$) and antimony oxide ($Sb_2O_5$) were also prepared as starting materials in addition to those mentioned above, and the starting powders were combined in different proportions so that each of the post-firing compositions was $(Pb_{1-a}A^1{}_a)Ti_xZr_{1-x-y-z-b}(Zn_{1/3}(Nb_{1-d}A^2{}_d)_{2/3})_y$ $(Yb_{1/2}(Nb_{1-d}A^2{}_d)_{1/2})_zSn_bO_3 + c$ mass % $MnCO_3$, with the type of elements $A^1$ and $A^2$ and the numerical values of a, b, c, x, y and z as shown in Table 2, to prepare different mixtures. The numerical value of d in the formula was 0.4.

[Evaluation of Properties]

Each of the oscillators obtained as samples No. 1-51 to 1-54 and 1-60 to 1-61 was measured for oscillation speed and its associated heat release, in the same manner as sample No. 1-1. The results are shown in Table 2.

TABLE 2

| Sample No. | Piezoelectric ceramic composition | | | | | | | | Property evaluation | |
|---|---|---|---|---|---|---|---|---|---|---|
| | $A^1$ | a | x | y | z | $A^2$ | b | c | Oscillation speed (m/sec) | Heat release (°C.) |
| 1-51 | Ca | 0.02 | 0.46 | 0.03 | 0.03 | Ta | 0.02 | 0.30 | 1.80 | 24.8 |
| 1-52 | Ca | 0.02 | 0.46 | 0.03 | 0.03 | Sb | 0.02 | 0.30 | 1.84 | 23.9 |
| 1-53 | Ca | 0.02 | 0.44 | 0.06 | 0.06 | Ta | 0.02 | 0.80 | 1.63 | 22.9 |
| 1-54 | Ca | 0.02 | 0.44 | 0.06 | 0.06 | Sb | 0.02 | 0.80 | 1.66 | 23.3 |
| 1-60 | Ca | 0.02 | 0.40 | 0.03 | 0.18 | Ta | 0.02 | 0.30 | 0.90 | 7.3 |
| 1-61 | Ca | 0.02 | 0.40 | 0.03 | 0.18 | Sb | 0.02 | 0.30 | 0.92 | 8.1 |

Table 2 confirms that sufficiently high oscillation speed and adequately reduced heat release were obtained by having complex oxide and Mn contents within the range of the invention (samples No. 1-51 to 1-54) compared to those not within the range (samples No. 1-60 to 1-61), even when a portion of Nb in the main complex oxide component was substituted by Ta or Sb.

Second Piezoelectric Element

Examples 2-1 to 2-35, Comparative Examples 2-1 to 2-8

As the starting materials for fabrication of piezoelectric ceramics, there were prepared powders of lead oxide (PbO), titanium oxide ($TiO_2$), zirconium oxide ($ZrO_2$), zinc oxide (ZnO), niobium oxide ($Nb_2O_5$), tin oxide ($SnO_2$), calcium carbonate ($CaCO_3$), strontium carbonate ($SrCO_3$), barium carbonate ($BaCO_3$) and manganese carbonate ($MnCO_3$).

The starting powders were weighed out so that the fired piezoelectric ceramics (sintered materials) satisfied the compositions listed in Tables 3 and 4. In Tables 3 and 4, a, b, x and y represent the numerical values of a, b, x and y in formula (2), respectively, and $A^1$ and $A^2$ represent elements $A^1$ and $A^2$ in formula (2). Also, c represents the manganese content, in terms of $MnCO_3$, with respect to the complex oxide represented by formula (2). Also, $a_{Sr}$, $a_{Ca}$ and $a_{Ba}$ represent the respective ratios of Sr, Ca and Ba when 2 or more elements were used as $A^1$, and $y_{ZnNb}$ and $y_{ZnW}$ represent the respective ratios of ZnNb and ZnW when Nb and W were used together as $A^2$.

$$(Pb_{1-a}A^1{}_a)Ti_xZr_{1-x-y-b}(Zn_{1/3}A^2{}_{2/3})_ySn_bO_3: \quad (2)$$

Each weighed out starting powder was then subjected to wet blending with a ball mill, and the obtained mixture was calcined in air at 700-850° C. for 2 hours to obtain a calcined body. The obtained calcined body was subjected to wet grinding with a ball mill to obtain a calcined powder. After then adding a small amount of a binder to the calcined powder, it was molded at a pressure of approximately 5 t/cm² to obtain a tabular compact with planar dimensions of 50 mm×50 mm and a thickness of 10 mm.

The obtained compact was fired in air at 950-1200° C. for 2 hours (main firing) to obtain a piezoelectric ceramic sample. Density measurement of each obtained piezoelectric ceramic sample showed that all of the samples had a density of at least 95% of theoretical density.

Each of the obtained piezoelectric ceramic samples was cut to 12 mm×3 mm and a thickness of 1 mm, and Ag electrodes were baked onto both sides. Next, polarization was conducted for 30 minutes in the thickness direction with a 2 kV/mm electric field, in silicone oil at 120° C., to obtain an oscillator.

The high-power driving characteristic of each oscillator was examined. As shown in FIG. 3, the center sections of the electrodes of the measuring element were held by contact probes, the driving voltage was set to 150 V with a rectangular driving waveform, and a signal at the driving frequency was applied having a numerical value near the resonance frequency previously determined using an impedance analyzer. The oscillation speed was determined from the value measured by a laser Doppler displacement meter, and the heat value was determined using a radiation thermometer.

Next, the resonance frequency between −20° C. and 80° C. was measured using an impedance analyzer, and the maximum (Fr(max)) and minimum (Fr(min)) resonance frequencies between −20° C. and 80° C., and the resonance frequency at 20° C. (Fr(20° C.)) were determined. The resonance frequency variation (ΔFr) was calculated from these numerical values and formula (α). The results for the oscillation speed and ΔFr are shown in Tables 3 and 4.

$$\Delta Fr = (Fr(\max) - Fr(\min))/Fr(20°\,C.) \quad (\alpha)$$

TABLE 3

| | $A^1$ | a | x | $A^2$ | y | b | c | Oscillation speed (m/sec) | ΔFr(%) |
|---|---|---|---|---|---|---|---|---|---|
| Comp. Ex. 2-1 | — | — | 0.49 | Nb | 0.02 | 0.02 | 0.8 | 1.56 | 1.10 |
| Example 2-1 | — | — | 0.48 | Nb | 0.03 | 0.02 | 0.8 | 1.70 | 0.13 |
| Example 2-2 | — | — | 0.47 | Nb | 0.06 | 0.02 | 0.8 | 1.79 | 0.55 |
| Example 2-3 | — | — | 0.47 | Nb | 0.09 | 0.02 | 0.8 | 1.29 | 0.54 |
| Example 2-4 | — | — | 0.47 | Nb | 0.12 | 0.02 | 0.8 | 1.15 | 0.73 |
| Example 2-5 | — | — | 0.47 | Nb | 0.15 | 0.02 | 0.8 | 1.09 | 0.81 |
| Example 2-6 | — | — | 0.47 | Nb | 0.18 | 0.02 | 0.8 | 1.05 | 0.90 |
| Example 2-7 | — | — | 0.46 | Nb | 0.06 | 0.02 | 0.8 | 1.77 | 0.56 |
| Example 2-8 | — | — | 0.46 | Nb | 0.09 | 0.02 | 0.8 | 1.42 | 0.58 |
| Example 2-9 | — | — | 0.46 | Nb | 0.12 | 0.02 | 0.8 | 1.15 | 0.64 |
| Example 2-10 | — | — | 0.46 | Nb | 0.15 | 0.02 | 0.8 | 1.18 | 0.68 |
| Example 2-11 | — | — | 0.46 | Nb | 0.18 | 0.02 | 0.8 | 1.10 | 0.69 |
| Example 2-12 | — | — | 0.45 | Nb | 0.09 | 0.02 | 0.8 | 1.45 | 0.52 |
| Example 2-13 | — | — | 0.45 | Nb | 0.12 | 0.02 | 0.8 | 1.28 | 0.55 |
| Example 2-14 | — | — | 0.45 | Nb | 0.15 | 0.02 | 0.8 | 1.33 | 0.48 |
| Example 2-15 | — | — | 0.45 | Nb | 0.18 | 0.02 | 0.8 | 1.18 | 0.64 |
| Example 2-16 | — | — | 0.43 | Nb | 0.12 | 0.02 | 0.8 | 1.37 | 0.34 |
| Example 2-17 | — | — | 0.43 | Nb | 0.15 | 0.02 | 0.8 | 1.34 | 0.38 |
| Example 2-18 | — | — | 0.43 | Nb | 0.18 | 0.02 | 0.8 | 1.29 | 0.49 |
| Example 2-19 | — | — | 0.41 | Nb | 0.18 | 0.02 | 0.8 | 1.75 | 0.23 |
| Example 2-20 | — | — | 0.40 | Nb | 0.20 | 0.02 | 0.8 | 1.47 | 0.08 |
| Comp. Ex. 2-2 | — | — | 0.39 | Nb | 0.25 | 0.02 | 0.8 | 1.22 | 1.57 |
| Comp. Ex. 2-3 | — | — | 0.46 | Nb | 0.06 | 0.02 | 0.1 | Not polarizable | Not polarizable |
| Example 2-21 | — | — | 0.46 | Nb | 0.06 | 0.02 | 0.2 | 1.75 | 0.75 |
| Example 2-22 | — | — | 0.46 | Nb | 0.06 | 0.02 | 0.4 | 1.79 | 0.65 |
| Example 2-23 | — | — | 0.46 | Nb | 0.06 | 0.02 | 1.0 | 1.64 | 0.36 |
| Example 2-24 | — | — | 0.46 | Nb | 0.06 | 0.02 | 3.0 | 1.42 | −0.40 |
| Comp. Ex. 2-4 | — | — | 0.46 | Nb | 0.06 | 0.02 | 4.0 | Not polarizable | Not polarizable |
| Comp. Ex. 2-5 | — | — | 0.47 | Nb | 0.06 | 0.01 | 0.4 | 1.77 | 1.03 |
| Example 2-25 | — | — | 0.45 | Nb | 0.06 | 0.04 | 0.4 | 1.79 | −0.11 |
| Comp. Ex. 2-6 | — | — | 0.44 | Nb | 0.06 | 0.06 | 0.4 | 1.77 | −1.50 |
| Example 2-26 | Ca | 0.02 | 0.46 | Nb | 0.06 | 0.02 | 0.4 | 1.77 | 0.21 |
| Example 2-27 | Ca | 0.04 | 0.46 | Nb | 0.06 | 0.02 | 0.4 | 1.42 | −0.29 |
| Example 2-28 | Sr | 0.02 | 0.46 | Nb | 0.06 | 0.02 | 0.4 | 1.72 | 0.25 |
| Example 2-29 | Ba | 0.02 | 0.46 | Nb | 0.06 | 0.02 | 0.4 | 1.73 | 0.29 |
| Example 2-30 | Ca Sr | 0.04 ($a_{Ca} = 0.02$, $a_{Sr} = 0.02$) | 0.46 | Nb | 0.06 | 0.02 | 0.4 | 1.32 | −0.38 |
| Example 2-31 | Ca Ba | 0.04 ($a_{Ca} = 0.02$, $a_{Ba} = 0.02$) | 0.46 | Nb | 0.06 | 0.02 | 0.4 | 1.32 | −0.39 |

TABLE 3-continued

| | $A^1$ | a | x | $A^2$ | y | b | c | Oscillation speed (m/sec) | ΔFr(%) |
|---|---|---|---|---|---|---|---|---|---|
| Example 2-32 | Ca Sr Ba | 0.03 ($a_{Ca}=0.01, a_{Sr}=0.01, a_{Ba}=0.01$) | 0.46 | Nb | 0.06 | 0.02 | 0.4 | 1.56 | −0.19 |
| Comp. Ex. 2-7 | Ca | 0.06 | 0.46 | Nb | 0.06 | 0.02 | 0.4 | 0.89 | −0.63 |

TABLE 4

| | $A^1$ | a | x | $A^2$ | y | b | c | Oscillation speed (m/sec) | ΔFr(%) |
|---|---|---|---|---|---|---|---|---|---|
| Example 2-33 | Ca | 0.02 | 0.46 | Nb W | 0.06 ($y_{ZnNb}=0.03, y_{ZnW}=0.03$) | 0.02 | 0.4 | 1.53 | 0.09 |
| Example 2-34 | Ca | 0.02 | 0.45 | Nb W | 0.09 ($y_{ZnNb}=0.03, y_{ZnW}=0.06$) | 0.02 | 0.4 | 1.06 | 0.57 |
| Example 2-35 | Ca | 0.02 | 0.40 | Nb W | 0.18 ($y_{ZnNb}=0.03, y_{ZnW}=0.15$) | 0.02 | 0.4 | 1.03 | 0.41 |
| Comp. Ex. 2-8 | Ca | 0.02 | 0.39 | Nb W | 0.21 ($y_{ZnNb}=0.03, y_{ZnW}=0.18$) | 0.02 | 0.4 | Not polarizable | Not polarizable |

Thus, it was confirmed that the piezoelectric ceramics of Examples 2-1 to 2-35 had sufficiently high oscillation speed for practical use, and also stable values of less than 1% for temperature characteristic variation. It was also confirmed that the piezoelectric ceramics of Comparative Examples 2-1 to 2-8 were inferior to the piezoelectric ceramics of Examples 2-1 to 2-35 in terms of both high oscillation speed and temperature characteristic variation stability.

EXPLANATION OF SYMBOLS

5: Piezoelectric ceramic, 2, 3: electrodes, 20: oscillator, 10: laminated piezoelectric element, 11: laminated body, 12: piezoelectric layer, 13A, 13B: internal electrode layers, 14: element assembly, 15, 16: protective layers, 17A, 17B: terminal electrodes, 18: active section, 19: inactive section.

What is claimed is:

1. A piezoelectric ceramic comprising a complex oxide having the composition represented by formula (1), and Mn, wherein the Mn content with respect to the total amount of complex oxide is 0.2-1.2 mass % in terms of $MnCO_3$, $$(Pb_{1-a}A^1{}_a)Ti_xZr_{1-x-y-z-b}(Zn_{1/3}A^2{}_{2/3})_y(Yb_{1/2}A^2{}_{1/2})_zSn_bO_3 \quad (1)$$

[In formula (1), $A^1$ represents at least one element selected from the group consisting of Ca, Sr and Ba, $A^2$ represents at least one element selected from the group consisting of Nb, Ta and Sb and includes at least Nb, and a, b, x, y and z are values satisfying formulas (1a), (1b), (1x), (1y) and (z), respectively,]

$$0 \leq a \leq 0.04 \quad (1a)$$

$$0 \leq b \leq 0.04 \quad (1b)$$

$$0.40 \leq x \leq 0.49 \quad (1x)$$

$$0.03 \leq y \leq 0.15 \quad (1y)$$

$$0.03 \leq z \leq 0.15 \quad (1z).$$

2. The piezoelectric ceramic according to claim 1, wherein $A^2$ includes Nb and at least one element selected from the group consisting of Ta and Sb.

3. A piezoelectric ceramic comprising:
a complex oxide represented by formula (2), and Mn,
wherein the Mn content in terms of $MnCO_3$ is 0.2-3 mass % with respect to the complex oxide, $$(Pb_{1-a}A^1{}_a)Ti_xZr_{1-x-y-b}(Zn_{1/3}A^2{}_{2/3})_ySn_bO_3 \quad (2)$$

[In formula (2), $A^1$ represents at least one element selected from among Ca, Sr and Ba, $A^2$ represents at least one element selected from among Nb and W, and $A^2$ includes at least Nb also, a, x, y and b are values satisfying formulas (2a), (2x), (2y) and (2b), respectively,]

$$0 \leq a \leq 0.04 \quad (2a)$$

$$0.4 \leq x \leq 0.48 \quad (2x)$$

$$0.03 \leq y \leq 0.2 \quad (2y)$$

$$0.02 \leq b \leq 0.04 \quad (2b).$$

4. The piezoelectric ceramic according to claim 3, wherein $A^2$ includes Nb and W.

5. A piezoelectric element comprising the piezoelectric ceramic according to claim 1.

6. A piezoelectric element comprising the piezoelectric ceramic according to claim 3.

7. A piezoelectric device comprising the piezoelectric element according to claim 5.

8. A piezoelectric device comprising the piezoelectric element according to claim 6.

* * * * *